United States Patent [19]

Yu et al.

[11] Patent Number: 5,173,441
[45] Date of Patent: Dec. 22, 1992

[54] LASER ABLATION DEPOSITION PROCESS FOR SEMICONDUCTOR MANUFACTURE

[75] Inventors: Chang Yu; Trung T. Doan, both of Boise, Id.

[73] Assignee: Micron Technology, Inc., Boise, Id.

[21] Appl. No.: 653,658

[22] Filed: Feb. 8, 1991

[51] Int. Cl.⁵ .................... H01L 21/428; B05D 3/06; B05D 5/12; B23K 26/00
[52] U.S. Cl. .................... 437/173; 437/245; 219/121.68; 219/121.69; 219/121.73; 219/121.8; 427/96; 427/271; 427/272; 427/444; 427/597
[58] Field of Search ............... 437/245, 173, 192, 194; 427/53.1; 219/121.68

[56] References Cited

U.S. PATENT DOCUMENTS

| | | | |
|---|---|---|---|
| T988.007 | 11/1979 | Drew et al. | 427/53.1 |
| 3,560,258 | 2/1971 | Brisbane . | |
| 4,081,653 | 3/1978 | Koo et al. | 437/173 |
| 4,743,463 | 5/1988 | Ronn et al. | 427/53.1 |
| 4,752,455 | 6/1988 | Mayer | 427/53.1 |
| 4,970,196 | 11/1990 | Kim et al. | 427/53.1 |
| 4,987,006 | 1/1991 | Williams et al. | 427/53.1 |
| 4,997,518 | 3/1991 | Madokoro | 437/190 |

OTHER PUBLICATIONS

H. M. Smith and A. F. Turner, "Vacuum Deposited Thin Films Using a Ruby Laser," Applied Optics vol. 4, No. 1, Jan. 1965 pp. 147-148.

Webster's Ninth New Collegiate Dictionary, 1985, Merriam-Webster Inc. p. 45.

Primary Examiner—Brian E. Hearn
Assistant Examiner—Linda J. Fleck
Attorney, Agent, or Firm—Nydegger & Associates

[57] ABSTRACT

A semiconductor manufacturing process for laser ablation deposition (LAD) in which metal features are written from a source substrate onto a target substrate. The source substrate and target substrate are mounted in close proximity to one another within a vacuum chamber. A laser beam is scanned in a programmed sequence or selected pattern through a transparent target substrate and onto a metallic film formed on the source substrate. Ablation of the metal film and deposition onto the target substrate may be closely controlled by the laser being focused directly at the metal film on the source substrate and by the selection of a source substrate having a suitable thermal conductivity. The process may be further controlled by selective heating of the source substrate. The process can be used to ablate and deposit a single or multiple metal layers on the target substrate. Additionally, the target substrate may be an optically transparent substrate so that the process may be used to fabricate photomask, electro-optic, and acousto-optic devices, transducers, and integrated circuits on insulator substrate.

24 Claims, 1 Drawing Sheet

LASER ABLATION DEPOSITION PROCESS FOR SEMICONDUCTOR MANUFACTURE

FIELD OF THE INVENTION

This invention relates to semiconductor manufacture and, more particularly, to a novel method of laser ablation deposition onto a target substrate in integrated circuit fabrication.

BACKGROUND OF THE INVENTION

Semiconductor fabrication photolithography processes have used light beams, electron beams, x-rays, and ion beams to expose fine patterns of a mask on a photoresist film on the doped surface of a thin semiconductor wafer substrate. The photoresist is then developed with a liquid solvent that removes the unexposed (or exposed) photoresist. The wafer is then etched to form the pattern. Successive processes like this use other masks to expose other fine patterns on new films of photoresist to form integrated circuits layer by layer on the wafer substrate. This process is termed photolithography.

In general, such photolithography processes are wet processes which require the semiconductor wafer to be exposed to liquid chemicals under controlled conditions. Moreover, several steps are typically required to form a desired pattern.

Photochemical reactions at the surface of a semiconductor can also be induced by a laser beam which heats the semiconductor to induce the chemical reaction. Ablative photodecomposition is a phenomenon observed at the surface of a metallic film to which laser pulses are directed and for which the fluence of a pulse exceeds a threshold. As a result, the products of ablative photodecomposition are ejected from the surface of the film, or "ablate". These ablated particles may then be deposited under the influence of a vacuum onto a target substrate. One such laser process is termed laser ablation deposition (LAD).

With laser ablation deposition (LAD), a desired metal pattern may be directly written on a target substrate without a photolithography process. This process is also termed as metal scribing or writing.

FIG. 1 is a schematic diagram of a representative prior art apparatus for performing a laser ablation deposition (LAD) process. In general, with this process a transparent support substrate 10 having a thin metal film 12 deposited thereon is situated in close proximity to a target substrate 14. The transparent support substrate 10 and target substrate 14 are mounted in a sealed process chamber 16 which is subjected to a vacuum source 18. A laser light source 20 directs a laser light beam 22 through a focusing lens 24 and through a quartz window 26 into the process chamber 16. The laser light beam 22 is focused upon the transparent support substrate 10 to ablate the thin metal film 12 along a desired pattern 28.

The laser beam is sufficient to produce a required intensity at the target (pulse fluence, in Joules/cm$^2$) and to melt the metal film 12 through the underlying transparent support substrate 10. The metal is then forward ablated from the transparent support substrate 10 onto the target substrate 14 in a desired pattern 30.

There are several limitations with this prior art laser ablation deposition method. In general, the ablation and deposition process is difficult to control because the transparent support substrate 10 must be formed of a transparent material such as quartz which typically has a low thermal conductivity. It is thus difficult to control the heating of the metal film 12 by the support substrate 10 to the laser fluence threshold necessary for ablating the film 12 onto the target substrate 14. In general, this process (LAD) is thus not adaptable to large scale semiconductor manufacturing.

The present invention is directed to a simple yet unobvious laser ablation deposition (LAD) method that allows the ablation of a metal film on a substrate to be closely controlled. This allows the process to be adapted to large scale production of semiconductor wafers.

SUMMARY OF THE INVENTION

In accordance with the present invention, a novel laser ablation deposition process suitable for semiconductor manufacture is provided. The process includes the steps of:

depositing a thin, metal film on a source substrate by a conventional deposition process;

mounting the source substrate and a transparent target substrate in close aligned proximity within a vacuum process chamber;

optionally heating the source substrate to a selected temperature range; and directing a laser light beam through the target substrate and onto the metal film such that the metal film of the source substrate is ablated and deposited onto the target substrate.

This laser ablation deposition (LAD) process is adapted to large scale repetitive semiconductor manufacture because the process can be closely controlled. In particular, the laser impinges directly upon the metal film of the source substrate (the light will be first absorbed by the metal film) and its fluency can be accurately selected to achieve controlled ablation. Further control may be achieved by heating the source substrate to a desired temperature range. Also, the source substrate can be chosen from materials of a wide range of thermal properties (thermal conductivity, specific heat, etc.) to meet a specific ablation deposition need. Additionally, the source substrate does not need to be restricted to optically transparent materials. Since there is not such limitation on the source substrate and by controlled heating of the source substrate, better ablation and deposition control can be achieved.

Additionally, with the process of the invention, metal features written on a target substrate are erasable. By rescanning the patterned target substrate with the laser pulse, the deposited metal can be ablated back to the original source.

Other objects, advantages, and capabilities of the present invention will become apparent as the description proceeds.

DETAILED DESCRIPTION OF THE INVENTION

The invention uses various materials which are electrically either conductive, insulating, or semiconducting; although the completed semiconductor circuit device itself is usually referred to as a "semiconductor".

A laser ablation deposition (LAD) process in accordance with the invention includes the steps of:

depositing either a single layer or multilayer of metal on a source substrate by a conventional deposition technique;

mounting the source substrate in a vacuum chamber and in close proximity to an optically transparent target substrate;

optionally heating the source substrate to a desired temperature; and scanning the metal layer on the source substrate by a high power laser pulse, (either a programmed laser beam stage motion or a photomask may be used) such that the metal layer is ablated and deposited onto the target substrate in a desired pattern.

Figure 2:
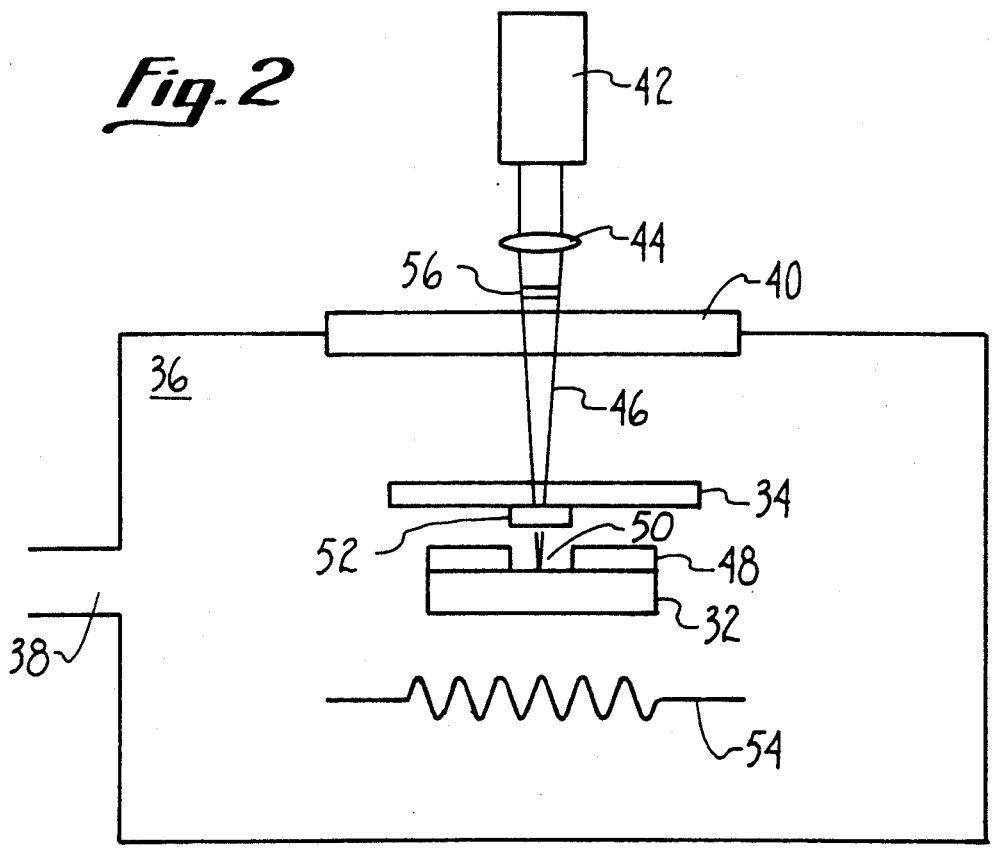
FIG. 2 is a schematic diagram of a laser ablation deposition (LAD) process performed in accordance with the invention.

Referring now to FIG. 2, a schematic diagram of a laser ablation deposition (LAD) process performed in accordance with the invention is shown. In general, the laser ablation deposition (LAD) process of the invention is adaptable to large scale semiconductor manufacture because the process can be closely controlled by direct laser impingement on metallic film. This allows a laser fluence to be selected to accurately control the ablation of the metal film and the deposition in a desired pattern onto a target substrate. The process may be further controlled by selective heating of the source substrate.

As shown in FIG. 2, a source substrate 32 having a metal film 48 deposited thereon and a target substrate 34 are mounted in close proximity (i.e. 10 micron ($\mu$) gap) within a vacuum process chamber 36. The vacuum process chamber 36 is subjected to a vacuum source 38. As an example, the process chamber 36 may be pumped by a turbomolecular pump to a nominal pressure of between $1 \times 10^{-3}$ to $1 \times 10^{-8}$ Torr. The process chamber 36 also includes a transparent quartz window 40 for entry of a laser light beam 46.

A laser light source 42 directs a laser light beam 46 through a focusing lens 44, through the quartz window 40 of the vacuum process chamber 36, and through the target substrate 34. The laser light source 42 can be produced by a conventional high power excimer laser, such as XeCl, ArF, and KrF, capable of producing pulses up to a few hundred milliJoules per square centimeter ($mJ/cm^2$) at a repetition rate of up to several hundred per second and at an invariant intensity. The laser light beam 46 may be scrambled and refocussed through a homogenizer to obtain a desired laser spot shape and a high degree of intensity uniformity across the laser spot. As an example, the laser light source 42 may produce a maximum energy of ~500 mJ per pulse, with a pulse duration of 25 nanoseconds (ns). In general, the threshold of intensity of the radiation (fluence per pulse) must transmit enough energy to the metal film 48 to evaporate and transport the fragments away from the source substrate 32.

The target substrate 34 must be optically transparent such that the laser light beam 46 can pass through the target substrate 34 and impinge directly onto the metal film 48 formed on the source substrate 32. By way of example, a suitable target substrate material may be fused quartz ($SiO_2$). Alternately, any other suitable transparent semiconductor material may be utilized.

The metallic film 48 may be initially deposited upon the source substrate 32 by any conventional means. The thin metallic film 48 is then ablated by the laser beam 46 by the process of the invention and deposited onto the target substrate 34. Suitable metallic films include Al, Ti, AlCu, and AlSiCu. A pattern 50 formed by programmed motion of the laser beam 46 or by a photomask 56, placed between the laser light source 42 and metallic film 48 causes the metallic film 48 to be ablated and deposited in a desired pattern 52 onto the target substrate 34.

A heater element 54 may be optionally mounted adjacent to the source substrate 32 for heating the source substrate and metallic film 48 to a desired temperature range. Since ablation threshold laser fluence is a function of source substrate temperature, a better process control can be achieved with this option. As an example, the source substrate 32 may be heated by a serpentine tungsten (W) filament. A representative source substrate 32 temperature range suitable for aluminum or an aluminum alloy metallic film 48 would be in the range of 250°-450° C.

Figure 1:
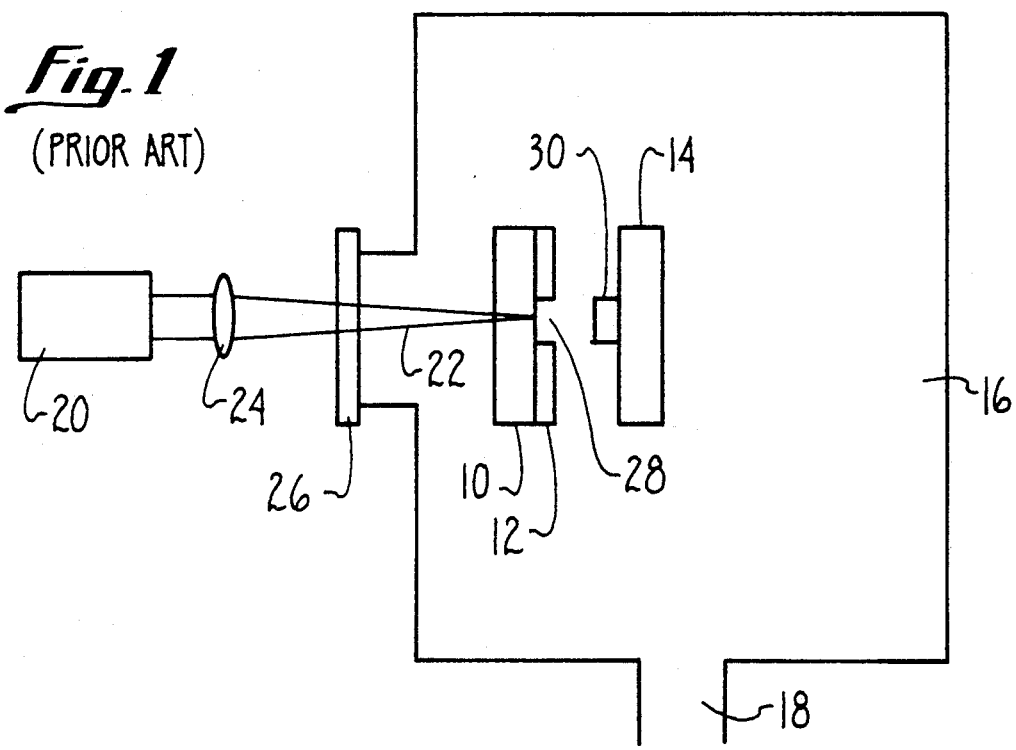
FIG. 1 is a schematic diagram of a prior art laser ablation deposition (LAD) process.

Because the metallic film 48 of the source substrate 32 is heated by direct laser impingement and because the temperature of the source substrate 32 can be closely controlled, a threshold laser fluence can be selected to achieve a controlled ablation and deposition onto the target substrate 34. This arrangement overcomes the inherent limitations of prior art laser ablation deposition (LAD) in which the temperature and ablation of the metallic film 12 (FIG. 1) is difficult to control because the transparent support 10 (FIG. 1) initially absorbs the laser energy, and it is thermally nonconductive.

As previously stated, patterned mask 56 may optionally be mounted at some point between the laser light source 42 and source substrate 32 for directing the laser beam 46 onto the metallic film 48 in an exact pattern.

Additionally, with the process of the invention, since the metal layer 48 is heated at its front side by the laser beam 46, for a multilayer composite (for example, Ti/AlCu or TiW/AlSiCu/TiW), a sequential layer-by-layer metal deposition is possible by carefully controlling the laser fluence and source substrate 32 temperature. This layer by layer ablation is possible because the depth of etching of the metal layer 48 per pulse is a function of the fluence of the laser pulse. Since the deposition is accomplished by "backward" ablation of metal from a source substrate 32 to a target substrate 34, the metal layers must be deposited on the source substrate 32 in a reverse order.

Thus the invention provides an improved laser ablation deposition (LAD) process for semiconductor manufacture. Some advantages of the invention over the prior art include the following.

Since there is no restriction on the source substrate 32, any substrate can be used for supporting the metallic film 48 to be ablated.

A better control of the ablation direction and threshold laser fluence can be achieved by using either a source substrate having an appropriate thermal conductivity or heating the source substrate to a desired temperature, or a combination of both.

Since the metal layer 48 is heated at its front side by direct impingement of the laser beam, for a multilayer composite (for example, Ti/AlCu or TiW/AlSiCu/TiW), a sequential layer-by-layer metal deposition is possible by carefully controlling the laser fluence and source substrate temperature.

The method of the invention provides a simple and economical technique for writing metal features onto a target without any conventional patterning steps, such as lithography and etch.

An additional advantage of the present invention is that metal features written on the target substrate are erasable. By simply rescanning the patterned transparent target substrate 34 by a laser pulse, the deposited metal can be ablated back to the original source substrate 32 or to a second target substrate.

)Cu(0.5%) and chemical vapor depositioned (CVD) W, with or without thin refractory metal coatings such as Ti, TiN, TiW, and chemical vapor depositioned W on top of them, are given in Table 1 (thickness of film is given in Angstrom, Å). In Table 1, the thin coatings on top of AlSiCu were used as anti-reflective coating (ARC) on AlSiCu film to increase the absorption of the laser beam.

TABLE 1

| Metal Stack | Substrate Temperature (°C.) | Ablation Threshold 1 (J/cm$^2$)* | Ablation Threshold 2 (J/cm$^2$)** |
|---|---|---|---|
| 10KÅ AlSiCu/1KÅ TiW | 300 | — | 4.8 |
| 200Å TiW/8KÅ AlSiCu/1KÅ TiW/200Å Ti | 250 | 1.4 | 1.7 |
| 7KÅ CVD W | 300 | — | 1.0 |
| 200Å Reactive TiN/8KÅ AlSiCu/1KÅ TiW | 300 | 2.1 | — |
| 300Å CVD W/8KÅ AlSiCu/1KÅ TiW | 300 | — | >3.0 |
| 100Å Ti/8KÅ AlSiCu/500Å Reactive TiN/500Å Ti | 300 | — | 3.6 |

*minimum laser fluence required for ablating the first layer (ARC layer)
**minimum laser fluence required for ablating the whole metal stack
All metal stacks were on borophosphosilicate glass (BPSG) substrate Experiments have been conducted by the inventors to test the invention. A pulsed XeCl excimer laser of 308 nanometers (nm) wavelength, 500 mJ maximum pulse energy, and 25 nanoseconds (ns) pulse duration was used for the laser ablation deposition. The laser beam shape and intensity across the beam spot was controlled by a beam homogenizer. The homogenizer was mounted on a motorized stage and a desired scanning pattern was achieved by programming the stage motion.

Both blank and patterned P-type <100> Si wafers were used as source substrates for these experiments. Metal films of AlSi(1%)Cu(0.5%), Ti, AlSi(1%)Cu(0.5%)/Reactive TiN, Ti/AlSiCu/Reactive TiN, and TiW/AlSiCu/Reactive TiN were sputtered in a multi-module, DC magnetron sputtering system. The AlSiCu film was typically 1 micrometer thick; and Ti, Reactive TiN, and TiW films ranged from 10 nm to 100 nm in thickness. Laser ablation deposition was carried out in a vacuum chamber of vacuum level $10^{-8}$ to $10^{-3}$ Torr. The substrate temperature was controlled by a tungsten filament placed about 5–10 cm below the source substrate. Laser ablation deposition of the above films was investigated at a laser fluence of 0.5 to 5.5 J/cm$^2$ and at a substrate temperature of room temperature to 400° C.

All of the above mentioned metal films were successfully deposited onto the target substrate (quartz plate) by the laser ablation deposition technique of the invention. The following results were obtained:

(1) For a given metal film/substrate system, the laser ablation deposition threshold (minimum laser fluence required for obtaining a laser ablation deposition) increases with the increasing metal film thickness and decreases with the increasing source substrate temperature. In addition, the interface between the source substrate and metal film significantly affects the minimum laser fluence required for the ablation deposition. In general, a greater amount of gas trapped at the interface decreases the ablation deposition threshold.

(2) For multi-layer metal films, such as Ti/AlSiCu/Reactive TiN, a layer-by-layer ablation deposition can be achieved by breaking vacuum between two metal layer depositions at the initial metal deposition step and using the desired laser fluence and substrate temperature at the laser ablation deposition step. The experimental results of AlSi(1%-

(3) The thermal properties of the source substrate can also significantly affect the ablation deposition process. In general, a lower laser fluence is required for laser ablation deposition for source substrates of lower thermal conductivity. The effect of source substrate on the laser ablation process has been demonstrated by the inventors on two substrates: borophosphosilicate glass (BPSG) and tetraethoxysilane (TEOS) as shown in Table 2.

TABLE 2

| Substrate | Substrate Temperature (°C.) | Ablation Threshold (J/cm$^2$)* |
|---|---|---|
| BPSG | 450 | 3.5 |
| TEOS | 450 | 2.3 |

Thus, the method of the invention provides a novel and unobvious technique for writing metal features onto a target substrate.

As will be apparent to those skilled in the art, however, certain changes and modifications can be made without departing from the scope of the invention as defined by the following claims.

What is claimed is:

1. A laser ablation deposition process for semiconductor manufacture, comprising:
   depositing a plurality of metal layers on a source substrate sequentially with an additional step of breaking vacuum between each successive metal layer deposition;
   mounting the source substrate in a vacuum chamber separated by a gap from and in close proximity to a target substrate which is optically transparent;
   heating the source substrate with a heating element to a desired temperature range; and
   scanning the metal layers on the source substrate by a laser beam passed through the target substrate for transmitting a threshold laser fluence to the metal layers to ablate the metal layers and transport fragments from the metal layers and deposit the fragments in a pattern upon the target substrate.

2. The process as defined in claim 1 and further comprising:
   using a source substrate having a thermal conductivity selected to provide a selected laser fluence and a controlled ablation of the metal films.

3. The process as defined in claim 2 and further comprising:

directing the laser beam through a mask for ablating and depositing the metal layers in a selected pattern.

4. The process as defined in claim 3 and further comprising:

rescanning the metal deposited onto the target substrate to erase the metal pattern.

5. The process as defined in claim 4 and wherein:

the target substrate is formed of $SiO_2$.

6. A laser ablation deposition process for semiconductor manufacture comprising:

depositing a first metal layer and a second metal layer on a source substrate with an additional step of breaking vacuum between the deposition of the second metal layer and the deposition of the first metal layer, having a selected thermal conductivity and a laser ablation deposition threshold;

mounting the source substrate in a vacuum chamber;

heating the source substrate with a heating element to a desired temperature range;

mounting an optically transparent target substrate in close proximity to the source substrate with the target substrate and source substrate separated by a gap;

scanning the first metal layer on the source substrate by a laser beam, of a selected energy and pulse duration passed through the target substrate to the first metal layer with a controlled fluence for transmitting a threshold laser fluence in order to ablate the first metal layer, transport metal across the gap and deposit the first metal layer onto the target substrate in a controlled manner; and scanning the second metal layer on the source substrate by a laser beam of a selected energy and pulse duration passed through the target substrate to the second metal layer with a controlled fluence for transmitting a threshold laser fluence in order to ablate and deposit the second metal layer on the first metal layer deposited on the target substrate in a layer by layer manner.

7. The laser ablation deposition process as recited in claim 6 and wherein:

the source substrate is heated to a temperature range of 250°–450° C.

8. The laser ablation deposition process as recited in claim 7 and wherein:

the metallic layer is an aluminum alloy.

9. The laser ablation deposition process as recited in claim 6 and wherein:

the metal layers are Ti and AlCu.

10. The laser ablation deposition process as recited in claim 6 and wherein:

the metal layers are TiW and AlSiCu.

11. The laser ablation deposition process as recited in claim 10 and wherein:

the metal layers further include another layer of TiW.

12. The laser ablation deposition process as recited in claim 11 and wherein:

the metal layers are TiW, AlSiCu, and Ti.

13. The laser ablation deposition process as recited in claim 11 and wherein:

the metal layers are TiN, AlSiCu, and TiW.

14. The laser ablation deposition process as recited in claim 11 and wherein:

the metal layers are W, AlSiCu, and TiW.

15. The laser ablation deposition process as recited in claim 11 and wherein:

the metal layers are Ti, AlSiCu, and TiN.

16. The laser ablation deposition process as recited in claim 11 and wherein:

the minimum laser fluence is in the range of 1.0 to 4.8 $J/cm^2$.

17. The laser ablation deposition process as recited in claim 6 and wherein:

the source substrate is selected from the group consisting of BPSG and TEOS.

18. The laser ablation deposition process as recited in claim 7 and wherein:

the vacuum chamber is maintained at a pressure of $1 \times 10^{-3}$ to $1 \times 10^{-8}$ Torr.

19. The laser ablation deposition process as recited in claim 7 and wherein:

the laser beam scans the metal film in a programmed stage motion to write the metal features in a desired pattern.

20. The laser ablation deposition process as recited in claim 7 and wherein:

the laser beam is passed through a photomask to ablate and deposit the metal film in a desired pattern upon the target substrate.

21. A laser ablation deposition process for semiconductor manufacture comprising:

initially depositing multiple layers of metal on a source substrate, of a selected thermal conductivity with an additional step of breaking vacuum between each successive metal layer deposition;

mounting the source substrate in a vacuum chamber at a pressure of $1 \times 10^{(-3)}$ to $1 \times 10^{(-8)}$ Torr;

mounting an optically transparent substrate in close proximity to but spaced from the source substrate;

scanning a first metal layer by an excimer laser focused though a lens, through the target substrate and to the first metal layer, with the laser energy and thermal conductivity of the source substrate selected to transmit a threshold laser fluence to the first metal layer in order to ablate metal from the source substrate and transport the metal through the gap onto the target substrate and deposit the first metal layer onto the target substrate; and heating the source substrate with a heating element mounted adjacent to the source substrate to a desired temperature range in order to further control ablation and deposition of the metal layers.

22. The laser ablation deposition process as recited in claim 21 and wherein:

the laser beam is programmed in a stage motion to scan the metal layer to write desired metal features on the target substrate.

23. The laser ablation deposition process as recited in claim 21 and wherein:

the laser beam is passed through a photomask to scan the metal layer in a pattern to form a desired pattern on the target substrate.

24. The laser ablation deposition process as recited in claim 21 and wherein:

the source substrate is selected from the group consisting of BPSG and TEOS.

* * * * *